United States Patent
Naji

(10) Patent No.: US 6,392,923 B1
(45) Date of Patent: May 21, 2002

(54) MAGNETORESISTIVE MIDPOINT GENERATOR AND METHOD

(75) Inventor: Peter K. Naji, Gilbert, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/793,163

(22) Filed: Feb. 27, 2001

(51) Int. Cl.$^7$ .............................................. G11C 11/00
(52) U.S. Cl. ....................................... 365/158; 365/210
(58) Field of Search ................................ 365/158, 209, 365/210, 173

(56) References Cited

U.S. PATENT DOCUMENTS

| | | | |
|---|---|---|---|
| 5,346,302 A | * 9/1994 | Cooper | 365/207 |
| 5,734,605 A | * 3/1998 | Zhu et al. | 365/173 |
| 6,317,376 B1 | * 11/2001 | Tran et al. | 365/210 |

* cited by examiner

Primary Examiner—Richard Elms
Assistant Examiner—VanThu Nguyen
(74) Attorney, Agent, or Firm—William E. Koch

(57) ABSTRACT

A magnetoresistive midpoint generator includes an input and an output terminal and four non-volatile magnetoresistive elements. Each element is programmable into a resistance equal to one of Rmax and Rmin, where Rmin is a minimum resistive value corresponding to parallel states of magnetization and Rmax is a maximum resistive value corresponding to anti-parallel states of magnetization. First and second series circuits, each series circuit including a magnetoresistive element with a resistance equal to Rmax connected in series with a magnetoresistive element with a resistance equal to Rmin, are connected in parallel between the input and output terminals, whereby a total resistance between the input and output terminals is a midpoint between Rmax and Rmin.

13 Claims, 3 Drawing Sheets

MAGNETORESISTIVE MIDPOINT GENERATOR AND METHOD

FIELD OF THE INVENTION

This invention relates to magnetoresistive devices and more particularly to non-volatile memories, digital to analog converters, analog to digital converters, and other devices requiring a midpoint (e.g. resistance or voltage) for the generation of output signals.

BACKGROUND OF THE INVENTION

In many devices, such as high density, high speed non-volatile memories, digital to analog converters, analog to digital converters, and other devices requiring a midpoint (e.g., resistance or voltage) for the generation of output signals, a midpoint, resistance or voltage, is generated using complex external or off-chip circuitry. Because the midpoint generators are external, they require extra space and large amounts of power. Thus, the external generators are relatively expensive.

Accordingly it is highly desirable to provide a midpoint generator for memory systems, and other devices requiring midpoint resistances for the generation of output signals.

BRIEF DESCRIPTION OF THE DRAWINGS

Referring to the drawings.

DESCRIPTION OF THE PREFERRED EMBODIMENTS

A magnetoresistive element can be viewed as a resistor with two states. The two states are Rmin and Rmax, where Rmin is the minimum value of the resistance of the element corresponding to parallel states of magnetization and Rmax is the maximum value of the resistance of the element corresponding to anti-parallel states of magnetization. The magnetoresistive elements described and utilized herein can be any of the well known types including magnetic tunneling junction (MTJ), giant magnetoresistive (GMR), AMR, etc Examples of MRAMs of each of these types are described in the patents set forth below, all of which are incorporated herein by reference. U.S. Pat. No. 5,702,831, entitled "Ferromagnetic GMR Material", issued Dec. 30, 1997; U.S. Pat. No. 5,732,016, entitled "Memory Cell Structure in a Magnetic Random Access Memory and a Method for Fabricating Thereof". issued Mar. 24, 1998; and U.S. Pat. No. 5,734,605 entitled "Multi-Layer Magnetic Tunneling Junction Memory Cells", issued Mar. 31, 1998.

Figure 1:
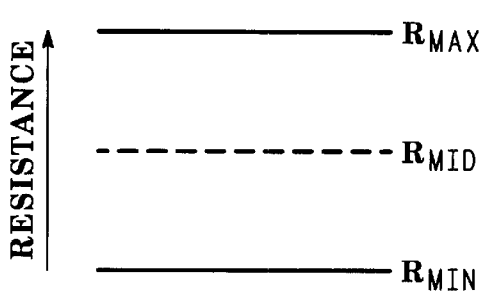
FIG. 1 is a graphical representation illustrating the relationship of various resistances discussed.

It is a purpose of this disclosure to utilize magnetoresistive elements to generate a midpoint resistance, Rmid, which is midway between Rmin and Rmax and, accordingly, apparatus is disclosed herein for generating the midpoint. Turning now to FIG. 1, a graphical representation is illustrated of the relationship of various resistances discussed. In this representation, Rmin is illustrated as a lower resistance line with Rmax being illustrated as a higher resistance line spaced some distance from Rmin. A midpoint resistance midway, or half way, between Rmin and Rmax is designated Rmid. The following equation describes the relationship of Rmid to Rmin and Rmax:

$$\text{Rmid} = (\text{Rmax} - \text{Rmin})/2 + \text{Rmin} \quad \text{Rmid} = \Delta R/2 + \text{Rmin} \quad (1)$$

where $\Delta R = \text{Rmax} - \text{Rmin}$

Figure 2:
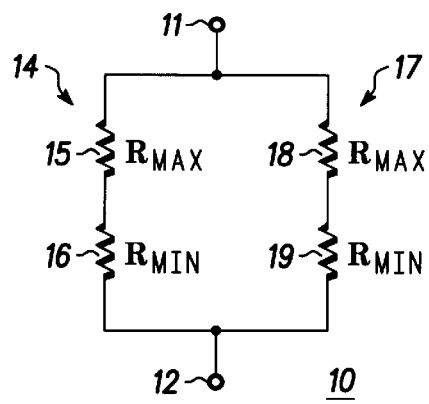
FIG. 2 is a simplified schematic diagram of a midpoint generator in accordance with the present invention.

Equation (1) is implemented by a series/parallel combination of magnetoresistive elements as illustrated in FIG. 2, which illustrates a simplified schematic diagram of a midpoint generator 10 in accordance with the present invention. Magnetoresistive elements can be combined in this manner because they are linear elements and, therefore, they can be treated as ordinary passive linear resistors. Generator 10 includes an input terminal 11 and an output terminal 12. A series circuit 14 includes a magnetoresistive element 15, with a resistance equal to Rmax, connected in series with a magnetoresistive element 16, with a resistance equal to Rmin, connected in series between input terminal 11 and output terminal 12. Another series circuit 17 includes a magnetoresistive element 18, with a resistance equal to Rmax, connected in series with a magnetoresistive element 19, with a resistance equal to Rmin, connected in series between input terminal 11 and output terminal 12. Series circuit 14 is also connected in parallel with series circuit 17 to form the series/parallel combination.

The series/parallel combination of resistances of generator 10 are combined as follows:

$$\text{Rmid} = (\text{Rmax} + \text{Rmin}) \| (\text{Rmax} + \text{Rmin}) = R_{AB}$$

where $R_{AB}$ is the total resistance between input terminal 11 and output terminal 12.

$$\begin{aligned} R_{AB} &= (R\text{max} + R\text{min})^2 / 2(R\text{max} + R\text{min}) \quad (2) \\ &= (R\text{max} + R\text{min})/2 \\ &= (\Delta R + R\text{min} + R\text{min})/2 \\ R_{AB} &= \Delta R/2 + R\text{min} \end{aligned}$$

It can be seen that equation (2) is equal to equation (1), i.e. $R_{AB}$ is equal to Rmid, and generator 10 successfully generates the midpoint Rmid.

In general, magnetoresistive elements are non-volatile memory elements which can be programmed into an Rmax or an Rmin state, where Rmin is a minimum resistive value corresponding to parallel states of magnetization and Rmax is a maximum resistive value corresponding to anti-parallel states of magnetization. Further, magnetoresistive elements are generally initially in the Rmin state and must be programmed into the Rmax state prior to the generation of Rmid. This programming can be done as a one time effort and, thereafter, Rmax is generated automatically without any need to reprogram, since the magnetoresistive elements hold their magnetization state in a non volatile fashion.

Figure 3:
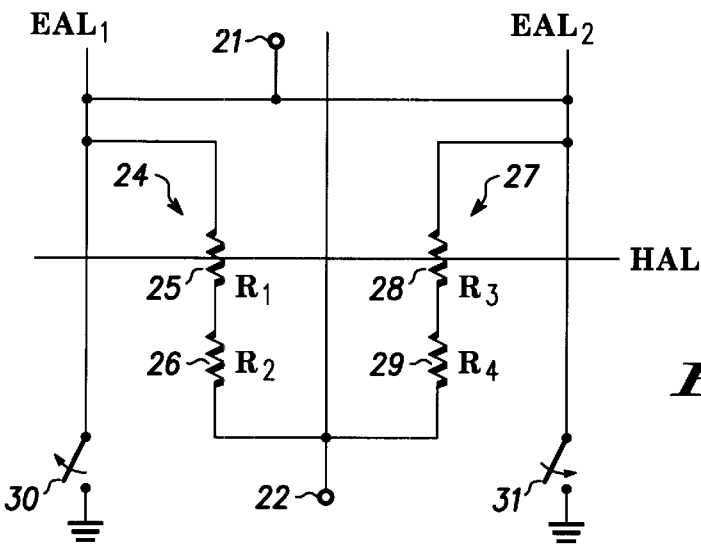
FIG. 3 is a schematic diagram of a specific embodiment of a midpoint generator in accordance with the present invention.

Turning to FIG. 3, a schematic diagram is illustrated of a specific embodiment of a programmable midpoint generator 20 in accordance with the present invention. Generator 20 includes an input terminal 21 and an output terminal 22. A series circuit 24 includes a magnetoresistive element 25 connected in series with a magnetoresistive element 26. Series circuit 24 is connected in series between an easy axis line EAL1 and output terminal 22. Another series circuit 27 includes a magnetoresistive element 28 connected in series with a magnetoresistive element 29. Series circuit 27 is connected in series between an easy axis line EAL2 and output terminal 22. Easy axis line EAL1 is magnetically associated with elements 25 and 26 and easy axis line EAL2 is magnetically associated with elements 28 and 29. Input terminal 21 is connected to both easy axis lines EAL1 and EAL2, which connects series circuit 24 in parallel with series circuit 27 to form the series/parallel combination. Also, EAL1 is connected to ground through a switch 30 and EAL2 is connected to ground through a switch 31. A hard axis line HAL is magnetically associated with magnetoresistive elements 25 and 28 to provide programming current in conjunction with easy axis lines EAL1 and EAL2.

Assuming for example that magnetoresistive elements 25 and 28 are MTJs, they are programmed into the Rmax state by utilizing the following steps. A hard axis current is sent through hard axis line HAL. Simultaneously, switch 30 is closed and switch 31 is opened and a current flows through easy axis line EAL1 which is sourced at input terminal 21 and sunk through switch 30 to ground. Also, output terminal 22 is open circuited. Thus, the combination of magnetic fields produced by current flowing in hard axis line HAL and easy axis line EAL1 combine to program magnetoresistive element 25 into the Rmax state. It should be noted that magnetoresistive element 26 remains in the Rmin state since hard axis current is not magnetically associated with element 26.

With hard axis current continuing to flow, switch 30 is opened, switch 31 is closed, and a current flows through easy axis line EAL2 which is sourced at input terminal 21 and sunk through switch 31 to ground. Output terminal 22 remains open circuited. Thus, the combination of magnetic fields produced by current flowing in hard axis line HAL and easy axis line EAL2 combine to program magnetoresistive element 28 into the Rmax state. It should be noted that magnetoresistive element 29 remains in the Rmin state since hard axis current is not magnetically associated with element 26. Also, magnetoresistive element 25 remains in the Rmax state since the elements are non-volatile. Once programming is complete, switches 30 and 31 are permanently opened, terminal 22 is reconnected or closed, and generator 20 provides Rmid between input terminal 21 and output terminal 22.

Figure 4:
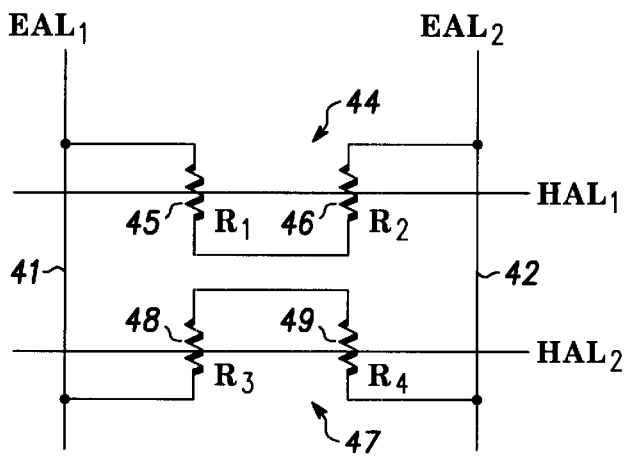
FIG. 4 is a schematic diagram of another embodiment of a midpoint generator in accordance with the present invention.

Referring specifically to FIG. 4, a preferred embodiment of a magnetoresistive midpoint generator 40 is illustrated. Generator 40 includes an easy axis line 41 (which serves as an input terminal for generator 40) and an easy axis line 42 (which serves as an output terminal for generator 40). A series circuit 44 includes a magnetoresistive element 45 connected in series with a magnetoresistive element 46. Series circuit 44 is connected in series between easy axis line 41 and easy axis line 42. Another series circuit 47 includes a magnetoresistive element 48 connected in series with a magnetoresistive element 49. Series circuit 47 is connected in series between an easy axis line 41 and easy axis line 42. Easy axis line 41 is magnetically associated with elements 45 and 48 and easy axis line 42 is magnetically associated with elements 46 and 49. Easy axis lines 41 and 42 connect series circuit 44 in parallel with series circuit 47 to form the series/parallel combination. A hard axis line HAL1 is magnetically associated with magnetoresistive elements 45 and 46 and a hard axis line HAL2 is magnetically associated with magnetoresistive elements 48 and 49 to provide programming current in conjunction with easy axis lines 41 and 42.

Assuming for example that all magnetoresistive elements 45, 46, 48, and 49 are MTJs, elements 45 and 48 are programmed into the Rmax state by utilizing the following steps. It will of course be understood from the following that elements 46 and 49 could alternatively be programmed into the Rmax state, if desired. In a first step, an easy axis current flows through line 41 (generally from top to bottom) and, simultaneously, a hard axis current flows through hard axis line HAL1, while no current flows through HAL2. The magnetic fields produced by this current flow are combined at element 45 where they will change the state of element 45 from Rmin to Rmax. During this programming, line 42 is an open circuit.

In a second step, easy axis current continues to flow through line 41 (generally from top to bottom). Line 42 remains an open circuit. Hard axis current is stopped in hard axis line HAL1 and started in hard axis line HAL2. The magnetic fields produced by this current flow are combined at element 48 where they will change the state of element 48 from Rmin to Rmax. Once programming is complete, line 42 is reconnected or closed, and generator 40 provides Rmid between line 41 and line 42.

Figure 5:
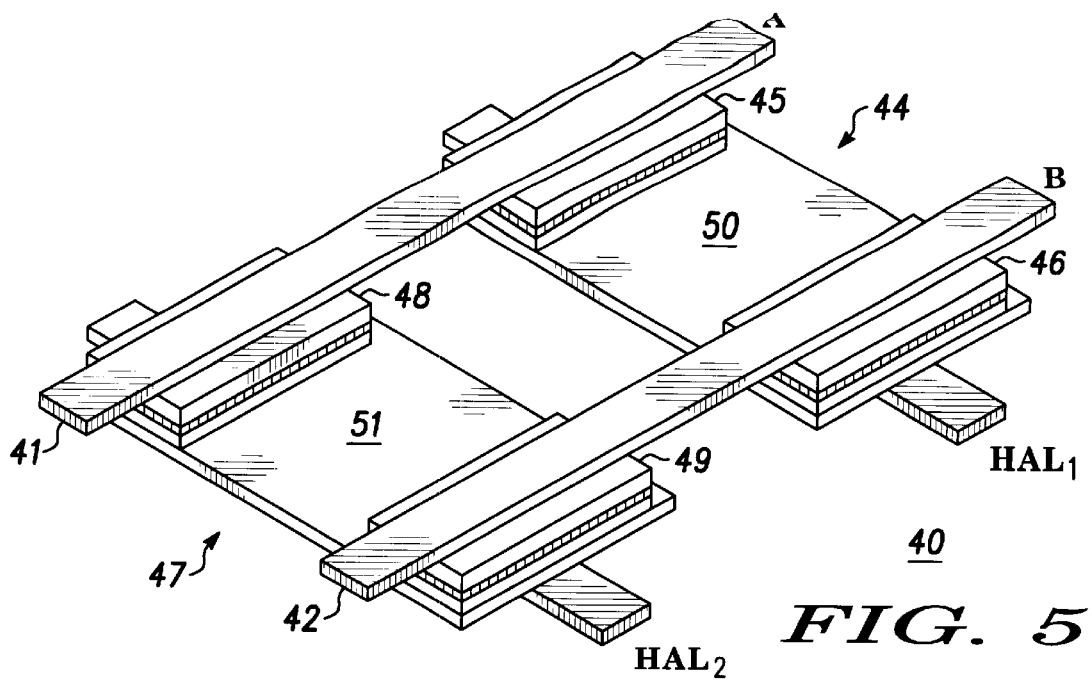
FIG. 5 illustrates a structural implementation of the midpoint generator of FIG. 4.

Referring additionally to FIG. 5, a simplified structural implementation of midpoint generator 40 of FIG. 4 is illustrated. In this specific structure magnetoresistive elements 45, 46, 48, and 49 are fabricated as MTJs, each including a lower magnetic layer with a magnetic vector pinned in a selected direction, a central electrically conducting layer, and an upper magnetic layer with a free magnetic vector. Additional information as to the fabrication and operation of MTJ cells can be found in U.S. Pat. No. 5,702,831, entitled "Multi-Layer Magnetic Tunneling Junction Memory Cells", issued Mar. 31. 1998, and incorporated herein by reference.

The lower layers of elements 45 and 46 are electrically connected through a common electrically conductive, but non-magnetic layer 50 and the lower layers of elements 48 and 49 are electrically connected through a common electrically conductive, but non-magnetic layer 51. Hard axis line HAL1 is positioned below and parallel with layer 50 so as to be magnetically coupled to both elements 45 and 46. Similarly, hard axis line HAL2 is positioned below and parallel with layer 51 so as to be magnetically coupled to both elements 48 and 49. Easy axis line 41 is positioned in contact with the upper layer of each of the elements 45 and 48 (extending perpendicular to HAL1 and HAL2). Easy axis line 42 is positioned in contact with the upper layer of each of the elements 46 and 49 (extending perpendicular to HAL1 and HAL2).

Thus, it can be seen that the presently disclosed magnetoresistive midpoint generator can be easily integrated into circuitry utilizing the midpoint, and especially into circuitry utilizing magnetoresistive elements, such as high density, high speed non-volatile memories, digital to analog converters, analog to digital converters, and other devices requiring a midpoint (e.g., resistance or voltage) for the generation of output signals. A typical example of such circuitry is a current conveyor for readout of a magnetic tunneling junction memory cell disclosed in a copending U.S. Patent Application entitled "Current Conveyor and Method For Readout of MTJ Memories", Ser. No. 09/540, 794, filed Mar. 31, 2000, assigned to the same assignee, and incorporated herein by reference. In such applications the magnetoresistive midpoint generator is fabricated on the same substrate and adjacent to the circuit utilizing the midpoint so that conditions affecting the circuit also affect the magnetoresistive midpoint generator, thus providing an extremely accurate midpoint.

Many magnetoresistive elements include a switching transistor, generally an NFET or the like, fabricated in series with the magnetoresistive element to provide control of the element (see the applications cited above). An embodiment of a magnetoresistive midpoint generator 60 utilizing this feature is illustrated in FIG. 6.

Figure 6:
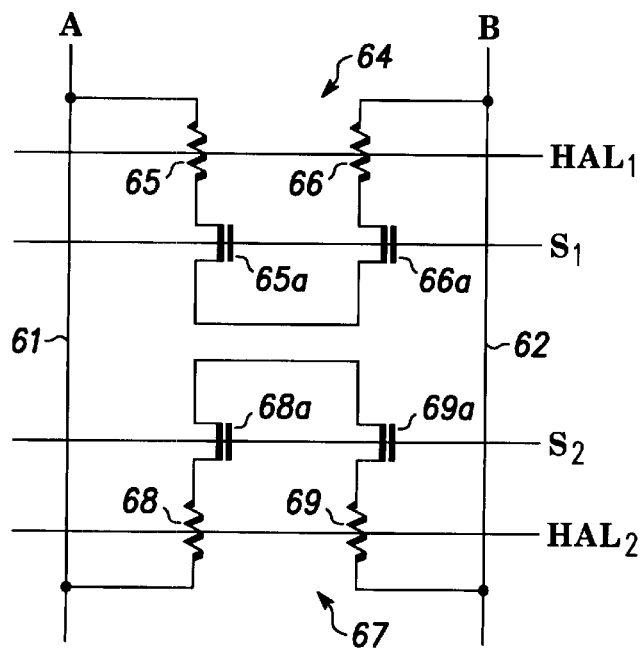
FIG. 6 is a schematic diagram of another embodiment of a midpoint generator in accordance with the present invention.

Turning specifically to FIG. 6, generator 60 includes an easy axis line 61 (which serves as an input terminal for generator 60) and an easy axis line 62 (which serves as an output terminal for generator 60). A series circuit 64 includes a magnetoresistive element 65 connected in series with a magnetoresistive element 66. Elements 65 and 66 each include a switching transistor 65a and 66a, respectively, connected in series. Series circuit 64 is connected in series between easy axis line 61 and easy axis line 62. Another series circuit 67 includes a magnetoresistive element 68 connected in series with a magnetoresistive element 69. Elements 68 and 69 each include a switching transistor 68a and 69a, respectively, connected in series (generally fabricated integrally therewith).

Series circuit 67 is connected in series between an easy axis line 61 and easy axis line 62. Easy axis line 61 is magnetically associated with elements 65 and 68 and easy axis line 62 is magnetically associated with elements 66 and 69. Easy axis lines 61 and 62 connect series circuit 64 in parallel with series circuit 67 to form the series/parallel combination. A hard axis line HAL1 is magnetically associated with magnetoresistive elements 65 and 66 and a hard axis line HAL2 is magnetically associated with magnetoresistive elements 68 and 69 to provide programming current in conjunction with easy axis lines 61 and 62.

A gate control line S1 is connected to the gates of switching transistors 65a and 66a and a gate control line S2 is connected to the gates of switching transistors 68a and 69a. Switching transistors 65a, 66a, 68a, and 69a are generally symmetrical transistors (usually fabricated integrally with the magnetoresistive element). The symmetrical location of switching transistors 65a, 66a, 68a, and 69a yields a total resistance equal to Rmid plus the resistance of one switching transistor. Therefore, only one switching transistor equivalent resistance is added to Rmid in the present novel structure and not four equivalent resistances.

Thus, a new and novel magnetoresistive midpoint generator is disclosed which has the advantages that it can be integrated into the circuitry using the midpoint without the need for external circuitry. Further, the magnetoresistive midpoint generator disclosed is a linear device, which greatly improves and simplifies it. Rmid closely tracks the equally important values of Rmin and ΔR and has a linear relationship with these two values. The magnetoresistive midpoint generator is non-volatile so that the Rmid value is stored forever whether current is supplied or not. Rmid is a result of inherent averaging present in the magnetoresistive midpoint generator. In other words, Rmid is basically the average of two series connected Rmax and Rmin circuits, or an average of Rmin and ΔR.

Figure 7:
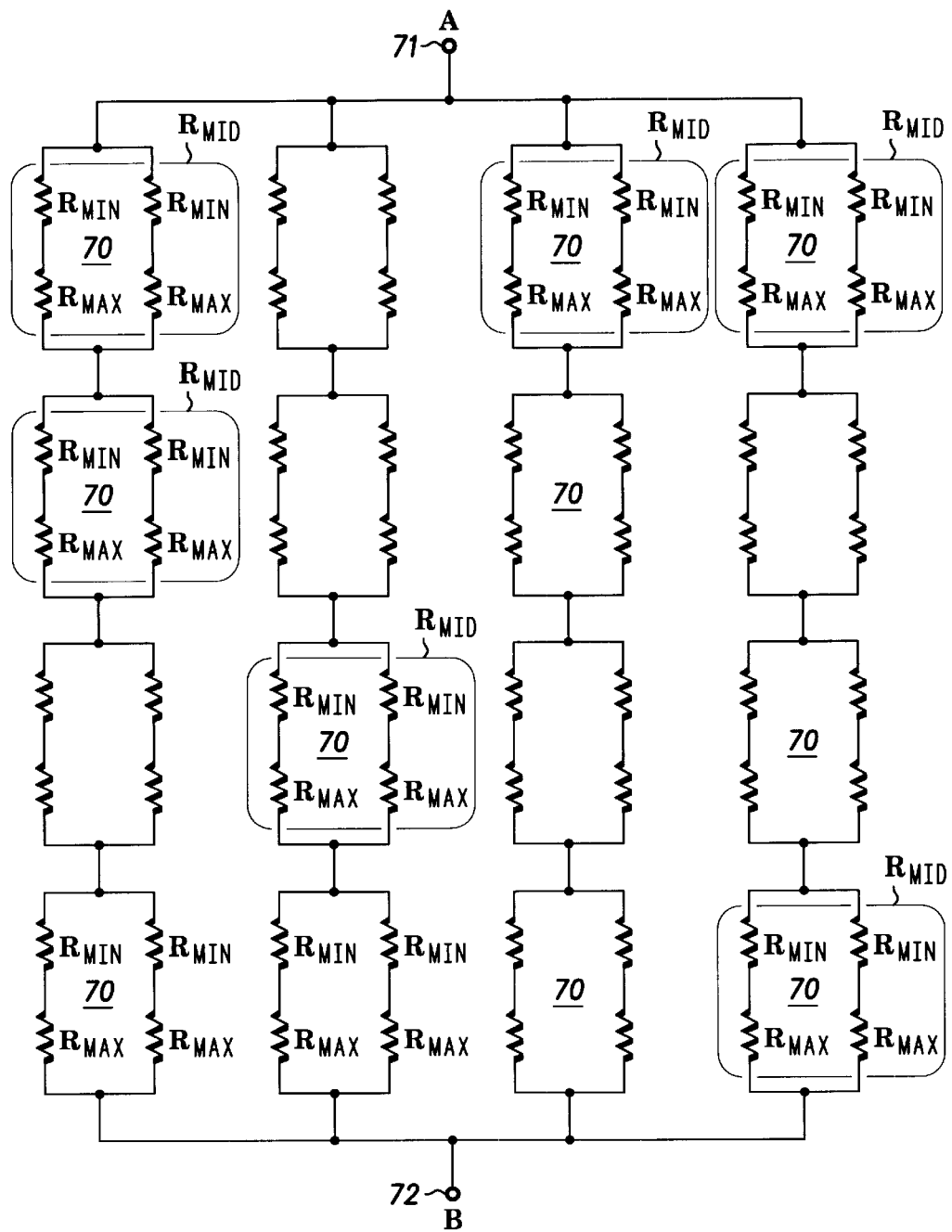
FIG. 7 is a schematic diagram of an embodiment of a system of distributed midpoint generators for a large integrated circuit in accordance with the present invention.

The averaging feature of Rmin and ΔR is an important feature when Rmid is used in relation with Rmin and Rmax elsewhere in a large integrated circuit. For example in a large memory fabricated on a single substrate it may be desirable to generate Rmid by averaging the outputs of a plurality of magnetoresistive midpoint generators distributed around the substrate. A circuit of this type is illustrated in FIG. 7. In this circuit sixteen magnetoresistive midpoint generators, each designated 70 and each similar to generator 10 in FIG. 2, are connected in an NxN array, in this example four columns of four generators each connected between an input terminal 71 and an output terminal 72. The total resistance between terminals 71 and 72, designated $R_{AB}$, is equal to $$R_{AB} = (1/4Rmid + 1/4Rmid + 1/4Rmid + 1/4Rmid)$$

$$= 4Rmid/4$$

$$R_{AB} = Rmid$$

Thus, an NxN matrix of Rmid generators can be established for higher averaging of Rmin and Rmax variations.

When dealing with magnetoresistive elements, it is understood that resistance of an element (i.e., both Rmin and Rmax, as well as the midpoint) can be changed by changing the size, shape, structure and material. However, in the preferred embodiment the disclosed midpoint generator is fabricated on a common substrate with the circuitry utilizing the midpoint. Generally, this circuitry includes magnetoresistive elements. A major advantage of the disclosed midpoint generator is that the magnetoresistive elements include therein are fabricated the same (e.g. the same size, shape, structure and material) as the magnetoresistive elements incorporated into the circuitry utilizing the midpoint generator. Thus, no special manufacturing steps or techniques are required.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A magnetoresistive midpoint generator comprising:

an input terminal and an output terminal;

a first series circuit including a first magnetoresistive element with a resistance equal to Rmax connected in series with a first magnetoresistive element with a resistance equal to Rmin, the first series circuit connected in series between the input terminal and the output terminal; and a second series circuit includiny a second magnetoresistive element with a resistance equal to Rmax connected in series with a second magnetoresistive element with a resistance equal to Rmin, the second series circuit connected in series between the input terminal and the output terminal and in parallel with the first series circuit;

a hard axis line positioned below and perpendicular with a first electrically conductive, non-magnetic layer positioned therebetween the hard axis line and in contact with a lower layer of the first magnetoresistive element having a resistance of Rmax, of the first series circuit and a lower layer of the first magnetoresistive element having a resistance of Rmin, of the first series circuit and a second electrically conductive, non-magnetic layer positioned therebetween the hard axis line and in contact with a lower layer of the second magnetoresistive element having a resistance of Rmax, of the second series circuit and the second magnetoresistive element having a resistance of Rmin of the second series circuit;

a first easy axis line positioned in contact with the magnetoresistive elements of the first series circuit and a second easy axis line positioned in contact with the magnetoresistive elements of the second series circuit, the hard axis line and the first and second easy axis line magnetically associated with the first and second series circuits for receiving programming current for programming the first magnetoresistive element with the resistance equal to Rmax, in the first series circuit and the second magnetoresistive element with the resistance equal to Rmax, in the second series circuit, whereby a total resistance between the input terminal and the output terminal is a midpoint between Rmax and Rmin.

2. The magnetoresistive midpoint generator as claimed in claim 1 wherein the first and second magnetoresistive elements in each of the first and second series circuits each include a non-volatile magnetoresistive element.

3. The magnetoresistive midpoint generator as claimed in claim 1 wherein each of the magnetoresistive elements has an Rmax and an Rmin state, where Rmin is a minimum resistive value corresponding to parallel states of magnetization and Rmax is a maximum resistive value corresponding to anti-parallel states of magnetization.

4. The magnetoresistive midpoint generator as claimed in claim 1 wherein the generator is integrated on a substrate with a circuit that uses the midpoint between Rmax and Rmin.

5. The magnetoresistive midpoint generator as claimed in claim 1 wherein the first and second magnetoresistive elements in each of the first and second series circuits each include a magnetic tunneling junction magnetoresistive element.

6. The magnetoresistive midpoint generator as claimed in claim 5 wherein the first and second magnetoresistive elements in each of the first and second series circuits each include a switching transistor in series with the magnetoresistive element.

7. The magnetoresistive midpoint generator as claimed in claim 6 including a first gate control line connected to a gate of each of the switching transistor in series with the magnetoresistive elements in the first series circuit and a second gate control line connected to a gate of each of the switching transistor in series with the magnetoresistive elements in the second series circuit.

8. A magnetoresistive midpoint generator comprising:

an input terminal and an output terminal;

first, second, third, and fourth non-volatile magnetoresistive elements each programmable into a resistance equal to one of Rmax and Rmin;

a first series circuit including the first and second magnetoresistive elements connected in series between the input terminal and the output terminal; and a second series circuit including the third and fourth magnetoresistive elements connected in series between the input terminal and the output terminal and in parallel with the first series circuit; and a first hard axis line positioned below and parallel with a first electrically conductive, non-magnetic layer positioned therebetween the first hard axis line and in contact with a lower layer of the first magnetoresistive element having a resistance of Rmax, of the first series circuit and a second magnetoresistive element having a resistance of Rmin, of the first series circuit and a second hard axis line positioned below and parallel with a second electrically conductive, non-magnetic layer positioned therebetween the second hard axis line and In contact with a lower layer of the third magnetoresistive element having a resistance of Rmax, of the second series circuit and the fourth magnetoresistive element having a resistance of Rmin, of the second series circuit;

a first easy axis line positioned in contact with the first magnetoresistive element of the first series circuit and the third magnetoresistive element of the second series circuit and a second easy axis line positioned in contact with the second magnetoresistive element of the first series circuit and the fourth magnetoresistive element of the second series circuit, the first hard axis line, the second hard axis line, the first easy axis line, and the second easy axis line magnetically associated with the first and second series circuits for receiving programming current for programming the first magnetoresistive element with the resistance equal to Rmax in the first series circuit and the third magnetoresistive element with the resistance equal to Rmax in the second series circuit, the second magnetoresistive element having the resistance equal to Rmin in the first series circuit and the fourth magnetoresistive element having the resistance equal to Rmin in the second series circuit, whereby a total resistance between the input terminal and the output terminal is u midpoint between Rmax and Rmin.

9. The magnetoresistive midpoint generator as claimed in claim 8 wherein the first and second magnetoresistive elements in each of the first and second series circuits each include a magnetic tunneling junction magnetoresistive element.

10. The magnetoresistive midpoint generator as claimed in claim 9 wherein the first and second magnetoresistive elements in each of the first and second series circuits each include a switching transistor in series with the magnetoresistive element.

11. The magnetoresistive midpoint generator as claimed in claim 10 including a first gate control line connected to a gate of each of the switching transistor in series with the magnetoresistive elements in the first series circuit and a second gate control line connected to a gate of each of the switching transistor in series with the magnetoresistive elements in the second series circuit.

12. An averaging magnetoresistive midpoint generator comprising:

an averaging input terminal and an averaging output terminal, an array of magnetoresistive midpoint generators each including an input terminal and an output terminal, a first series circuit including a first magnetoresistive element with a resistance equal to Rmax connected in series with a first magnetoresistive element with a resistance equal to Rmin, the first series circuit connected in series between the input terminal and the output terminal, and a second series circuit including a second magnetoresistive element with a resistance equal to Rmax connected in series with a second magnetoresistive element with a resistance equal to Rmin, the second series circuit connected in series between the input terminal and the output terminal and in parallel with the first series circuit;

the array of magnetoresistive midpoint generators being connected into a series parallel circuit between the averaging input terminal and the averaging output terminal, so as to produce a total average resistance between the averaging input terminal and the averaging output terminal that is an average midpoint between Rmax and Rmin for each of the magnetoresistive midpoint generators.

13. The averaging magnetoresistive midpoint generator as claimed in claim 12 wherein the array of magnetoresistive midpoint generators are connected in an nxn array, wherein is the number of magnetoresistive elements in a now of the array and in a column of the array.

* * * * *

UNITED STATES PATENT AND TRADEMARK OFFICE
CERTIFICATE OF CORRECTION

PATENT NO.     : 6,392,923 B1                                          Page 1 of 1
DATED          : May 21, 2002
INVENTOR(S)    : Naji It is certified that error appears in the above-identified patent and that said Letters Patent is hereby corrected as shown below:

<u>Column 1,</u>
Line 3, please add as a new first paragraph the following paragraph:

-- This invention was made with Government support under Agreement No. MDA972-96-3-0016 awarded by DARPA. The Government has certain rights in the invention. --

Signed and Sealed this

Sixteenth Day of September, 2003

JAMES E. ROGAN
*Director of the United States Patent and Trademark Office*